US008658435B2

(12) United States Patent
Czabaj et al.

(10) Patent No.: US 8,658,435 B2
(45) Date of Patent: Feb. 25, 2014

(54) HYDROGEN BARRIER LINER FOR FERRO-ELECTRIC RANDOM ACCESS MEMORY (FRAM) CHIP

(71) Applicant: International Business Machines Corporation, Armonk, NY (US)

(72) Inventors: Brian M. Czabaj, Essex Junction, VT (US); James V. Hart, III, Washington, VT (US); William J. Murphy, North Ferrisburgh, VT (US); James S. Nakos, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/748,038

(22) Filed: Jan. 23, 2013

(65) Prior Publication Data

US 2013/0137233 A1 May 30, 2013

Related U.S. Application Data

(62) Division of application No. 12/946,915, filed on Nov. 16, 2010, now Pat. No. 8,395,196.

(51) Int. Cl.
*H01L 21/00* (2006.01)

(52) U.S. Cl.
USPC .............................................................. 438/3

(58) Field of Classification Search
USPC .................................................................. 438/3
See application file for complete search history.

(56) References Cited

U.S. PATENT DOCUMENTS

| 5,317,187 | A | 5/1994 | Hindman et al. |
| 5,475,248 | A | 12/1995 | Takenaka |
| 5,523,595 | A | 6/1996 | Takenaka et al. |
| 6,239,462 | B1 | 5/2001 | Nakao et al. |
| 6,249,014 | B1 | 6/2001 | Bailey |
| 6,281,535 | B1 | 8/2001 | Ma et al. |
| 6,313,491 | B1 | 11/2001 | Shuto |
| 6,358,755 | B1 | 3/2002 | Evans |
| 6,605,835 | B2 | 8/2003 | Lee |
| 6,613,586 | B2 * | 9/2003 | Bailey ................................ 438/3 |
| 6,876,021 | B2 | 4/2005 | Martin et al. |
| 7,176,038 | B2 * | 2/2007 | Mitsuhashi ....................... 438/3 |
| 7,456,454 | B2 | 11/2008 | Sashida |

(Continued)

OTHER PUBLICATIONS

Park et al., "Ultra-thin EBL (Encapsulated Barrier Layer) for Ferroelectric Capacitor", IEDM, 1997, pp. 617-620.

(Continued)

*Primary Examiner* — Jae Lee
*Assistant Examiner* — Grant Withers
(74) *Attorney, Agent, or Firm* — Richard M. Kotulak; Hoffman Warnick LLC

(57) ABSTRACT

A method for forming a hydrogen barrier liner for a ferroelectric random access memory chip including forming a first dielectric layer over a substrate; forming a gate over the first dielectric layer; forming a first aluminum oxide layer over the gate and the first dielectric layer; forming a second dielectric layer over the first aluminum oxide layer; etching a trench through the second dielectric layer and the first aluminum oxide layer to the gate; forming a hydrogen barrier liner over the second dielectric layer, the hydrogen barrier liner lining the trench and contacting the gate; forming a silicon dioxide layer over the first aluminum dioxide layer, the silicon dioxide layer substantially filling the trench; and substantially removing the silicon dioxide layer leaving a silicon dioxide plug in the trench.

14 Claims, 14 Drawing Sheets

(56) References Cited

U.S. PATENT DOCUMENTS

| | | |
|---|---|---|
| 7,501,675 B2 | 3/2009 | Natori et al. |
| 7,504,684 B2 | 3/2009 | Kanaya |
| 7,517,703 B2 | 4/2009 | Son et al. |
| 7,573,120 B2 | 8/2009 | Natori et al. |
| 7,576,377 B2 | 8/2009 | Hayashi |
| 7,579,641 B2 | 8/2009 | Sashida |
| 7,598,556 B2 | 10/2009 | Mikawa et al. |
| 7,605,007 B2 | 10/2009 | Wang |
| 7,615,814 B2 | 11/2009 | Noma et al. |
| 7,772,629 B2 | 8/2010 | Fukada |
| 7,812,384 B2 | 10/2010 | Ozaki |
| 7,816,150 B2 | 10/2010 | Nakamura |
| 2001/0018237 A1 | 8/2001 | Hartner et al. |
| 2002/0050627 A1 | 5/2002 | Zambrano |
| 2002/0117700 A1 | 8/2002 | Fox |
| 2002/0149040 A1 | 10/2002 | Sun et al. |
| 2002/0153542 A1 | 10/2002 | Gnadinger |
| 2003/0001177 A1 | 1/2003 | Okutoh et al. |
| 2003/0006439 A1 | 1/2003 | Bailey |
| 2003/0087500 A1 | 5/2003 | Waki et al. |
| 2003/0089954 A1 | 5/2003 | Sashida |
| 2004/0099893 A1 | 5/2004 | Martin et al. |
| 2005/0218443 A1 | 10/2005 | Tamura et al. |
| 2006/0043446 A1 | 3/2006 | Fukada |
| 2007/0007567 A1 | 1/2007 | Yaefashi et al. |
| 2007/0045687 A1 | 3/2007 | Kumura et al. |
| 2007/0080382 A1 | 4/2007 | Kikuchi et al. |
| 2007/0284637 A1 | 12/2007 | Fukada |
| 2008/0121957 A1 | 5/2008 | Kanaya |
| 2008/0173912 A1 | 7/2008 | Kumura et al. |
| 2008/0199976 A1 | 8/2008 | Yamagata et al. |
| 2008/0224195 A1 | 9/2008 | Wang et al. |
| 2008/0277704 A1 | 11/2008 | Kanaya |
| 2008/0290385 A1 | 11/2008 | Urushido |
| 2009/0095994 A1 | 4/2009 | Kanaya et al. |
| 2009/0127604 A1 * | 5/2009 | Noda .................... 257/295 |
| 2010/0072524 A1 | 3/2010 | Huai et al. |
| 2010/0078693 A1 | 4/2010 | Nakao |
| 2010/0102370 A1 | 4/2010 | Kanaya |
| 2010/0117127 A1 * | 5/2010 | Kumura .................... 257/295 |
| 2010/0163944 A1 | 7/2010 | Kanaya |
| 2010/0193851 A1 | 8/2010 | Nagai |
| 2010/0207178 A1 | 8/2010 | Takahashi et al. |
| 2010/0264476 A1 | 10/2010 | Fukada |
| 2010/0320519 A1 | 12/2010 | Nagai |
| 2011/0101432 A1 | 5/2011 | Wang |
| 2013/0149794 A1 * | 6/2013 | Wang .................... 438/3 |

OTHER PUBLICATIONS

Withers, Notice of Allowance and Fee(s) Due for U.S. Appl. No. 12/946,915 dated Nov. 5, 2012, 8 pages.

Withers, Office Action Communication for U.S. Appl. No. 12/946,915 dated Aug. 9, 2012, 14 pages.

* cited by examiner

HYDROGEN BARRIER LINER FOR FERRO-ELECTRIC RANDOM ACCESS MEMORY (FRAM) CHIP

CROSS REFERENCE TO RELATED APPLICATION

This application is a divisional application of co-pending U.S. patent application Ser. No. 12/946,915, Filed Nov. 16, 2010, which is hereby incorporated herein.

BACKGROUND OF THE INVENTION

This invention relates generally to ferro-electric random access memory (FRAM) and more particularly to a hydrogen barrier liner for a FRAM chip.

FRAM chips are non-volatile memory cells and may include piezoelectric (PZT) material. PZT material includes lead oxide. The process used for manufacturing FRAM chips may include insulator depositions and metal depositions. Insulator depositions and some metal depositions may be hydrogen bearing processes. Hydrogen reacts with PZT material and deteriorates it by converting it to lead and water vapor.

FRAM chips may include tungsten, copper or aluminum wires connecting to electrodes of the FRAM chips. Tungsten contacts connect the copper or aluminum wires to a source or a drain. Etching the vias for contacting the FRAM electrodes creates a pathway for hydrogen by transporting along the metallurgy to reach the PZT material.

Reducing the exposure of PZT material to hydrogen during hydrogen bearing deposition and etch processes reduces the deterioration of the PZT material.

BRIEF SUMMARY OF EMBODIMENTS OF THE INVENTION

A first aspect of the invention includes a ferro-electric random access memory (FRAM) chip, comprising: a substrate; a first dielectric layer over the substrate; a gate over the first dielectric layer; a first aluminum oxide layer over the first dielectric layer and the gate; a second dielectric layer over the first aluminum oxide layer; a trench through the second dielectric layer and the first aluminum oxide layer to the gate; a hydrogen barrier liner over the second dielectric layer and lining the trench, and contacting the gate; and a silicon dioxide plug over the hydrogen barrier liner substantially filling the trench.

A second aspect of the invention includes a method, comprising: forming a first dielectric layer over a substrate; forming a gate over the first dielectric layer; forming a first aluminum oxide layer over the gate and the first dielectric layer; forming a second dielectric layer over the first aluminum oxide layer; etching a trench through the second dielectric layer and the first aluminum oxide layer to the gate; forming a hydrogen barrier liner over the second dielectric layer, the hydrogen barrier liner lining the trench and contacting the gate; forming a silicon dioxide layer over the first aluminum dioxide layer, the silicon dioxide layer substantially filling the trench; and substantially removing the silicon dioxide layer leaving a silicon dioxide plug in the trench.

A third aspect of the invention includes a method, comprising: forming a first dielectric layer over a substrate; forming a gate over the first dielectric layer; forming a first aluminum oxide layer over the gate and the first dielectric layer; forming a second dielectric layer over the first aluminum oxide layer; etching a trench through the second dielectric layer to the gate; forming a hydrogen barrier liner over the second dielectric layer, the hydrogen barrier liner lining the trench and contacting the gate; forming a silicon dioxide layer over the first aluminum dioxide layer, the silicon dioxide layer substantially filling the trench; substantially removing the silicon dioxide layer leaving a silicon dioxide plug in the trench; removing a portion of the silicon dioxide plug in the trench forming a recess in the trench over the silicon dioxide plug; forming a titanium nitride layer over the silicon dioxide plug; and forming a titanium layer over the titanium nitride layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF EMBODIMENTS OF THE INVENTION

Figure 1:
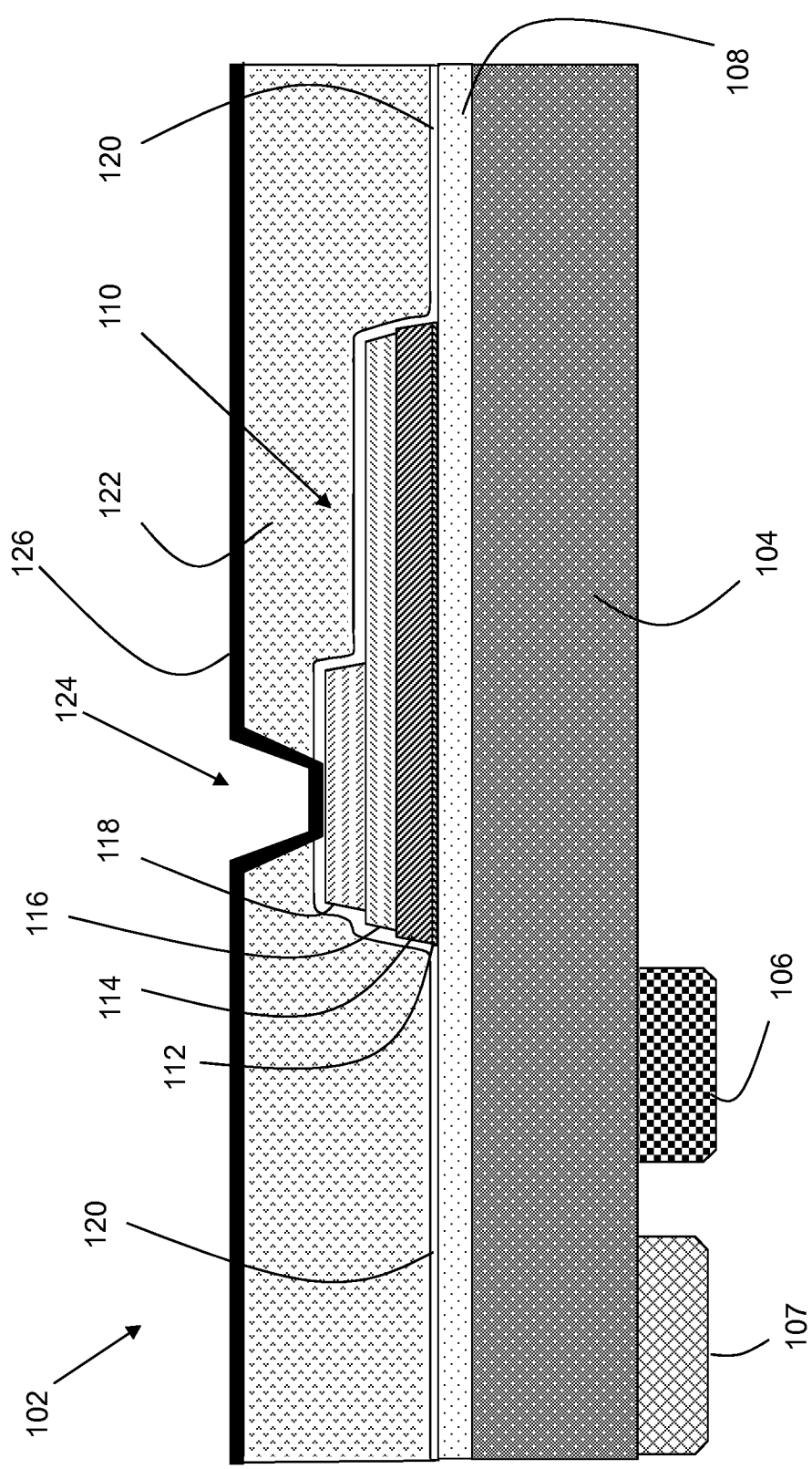
FIG. 1 shows a cross-section view of one embodiment of a step in processing of a FRAM chip in accordance with this invention.

Referring to FIG. 1, a cross-section view of one embodiment of a step in processing of a FRAM chip 102 is illustrated. FRAM chip 102 includes a substrate 104. A source 106 and a drain 107 may be formed in substrate 104. A first dielectric layer 108 may be formed over substrate 104. A gate 110 may be formed over first dielectric layer 108. Forming gate 110 may include depositing an adhesion layer 112. Adhesion layer 112 may include, for example, titanium oxide. Forming gate 110 may also include forming a first platinum (Pt) layer 114 over adhesion layer 112, forming a PZT layer 116 over first Pt layer 114, and forming an iridium oxide (IrOx) layer 118 over PZT layer 116. A first aluminum oxide (AlOx) layer 120 may be formed over substrate 104 and over gate 110. A second dielectric layer 122 may be formed over first AlOx layer 120. Forming of substrate 104, source 106, drain 107, first dielectric layer 108, gate 110, first AlOX layer 120, and second dielectric layer 122 may use any known or to be developed deposition, mask, resist, etching, and planarization techniques. As understood other structures have been omitted for clarity. The omitted structures may include any conventional interconnect components such as transistors, memory components (SRAM), etc.

Substrate 104 may be comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 104 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 104, as illustrated and described, are well known in the art and thus, no further description is necessary.

Dielectric layers, including first dielectric layer 108 and second dielectric layer 122, may include silicon oxide ($SiO_2$), silicon nitride (SiN), or any other suitable material. Any number of dielectric layers may be located over the chip body, as may other layers included in semiconductor chips now known or later developed. In one embodiment, dielectric layers may include silicon oxide ($SiO_2$) for its insulating, mechanical and optical qualities. Dielectric layers may include but are not limited to: silicon nitride ($Si_3N_4$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available form JSR Corporation, other low dielectric constant (<3.9) material, or layers thereof. Dielectric layers may be deposited using conventional techniques described herein and/or those known in the art.

As used herein, the term "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
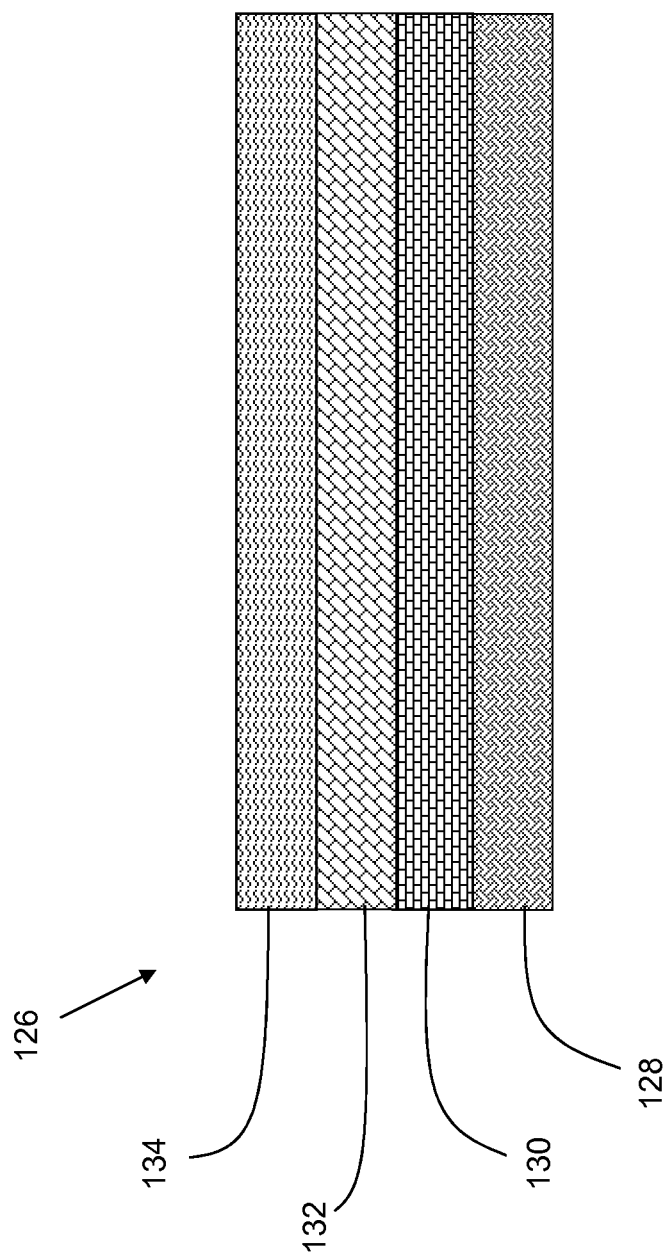
FIG. 2 shows a cross-section view of one embodiment of a hydrogen barrier liner of FRAM chip in accordance with this invention.
Figure 3:
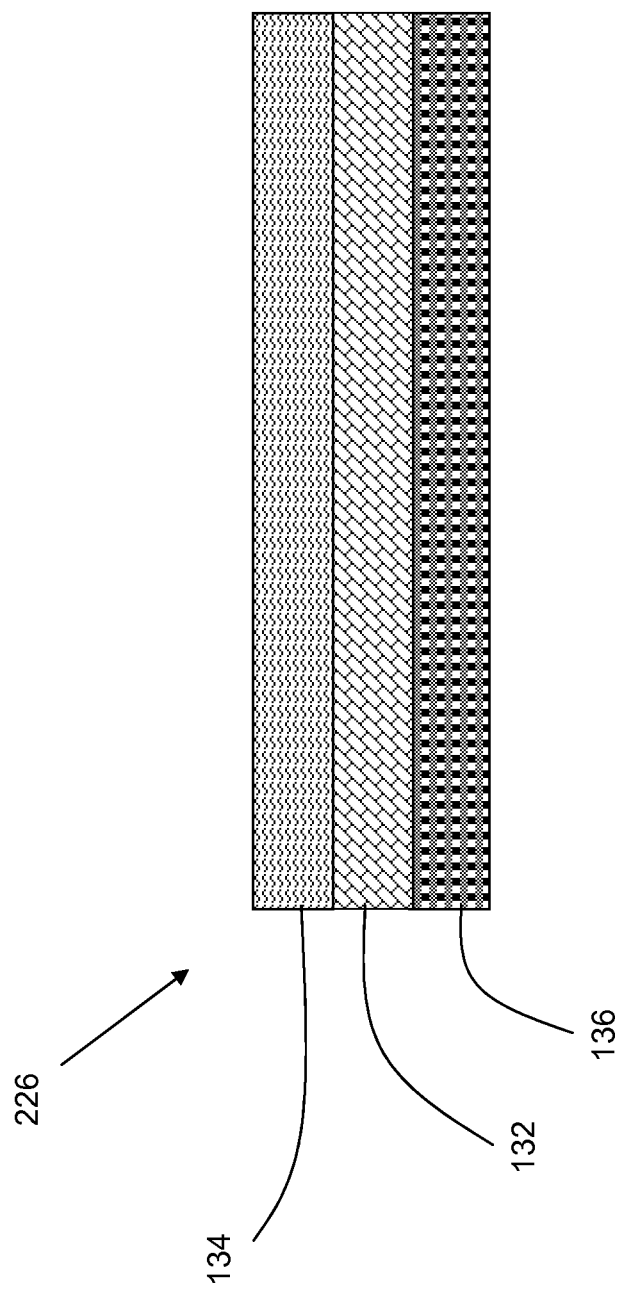
FIG. 3 shows a cross-section view of one alternative embodiment of hydrogen barrier liner of FRAM chip in accordance with this invention.

Continuing with FIG. 1, second dielectric layer 122 may be etched forming a trench 124 over gate 110. Etching may include a plasma Y etch. A hydrogen barrier liner 126 may be deposited lining trench 124. Referring to FIG. 2, a cross-section view of one embodiment of hydrogen barrier liner 126 as applied to FIG. 1 is illustrated. Depositing hydrogen barrier liner 126 may include depositing a second IrOx layer 128, depositing an iridium (Ir) layer 130 over second IrOx layer 128, depositing a (Ti) titanium layer 132 over the Ir layer 130, and depositing a second AlOx layer 134 over Ti layer 132. Referring to FIG. 3, a cross-section view of an alternative embodiment of hydrogen barrier liner 226 as applied to FIG. 1 is illustrated. Hydrogen barrier liner 226 may include depositing a second Pt layer 136, depositing Ti layer 132 over second Pt layer 136, and depositing second AlOx layer 134 over Ti layer 132. Depositing of second IrOx layer 128, Ir layer 130, Ti layer 132, and second Pt layer 136 may include, for example, PVD. Depositing of second AlOx layer 134 may include, for example, PVD or CVD.

Figure 4:
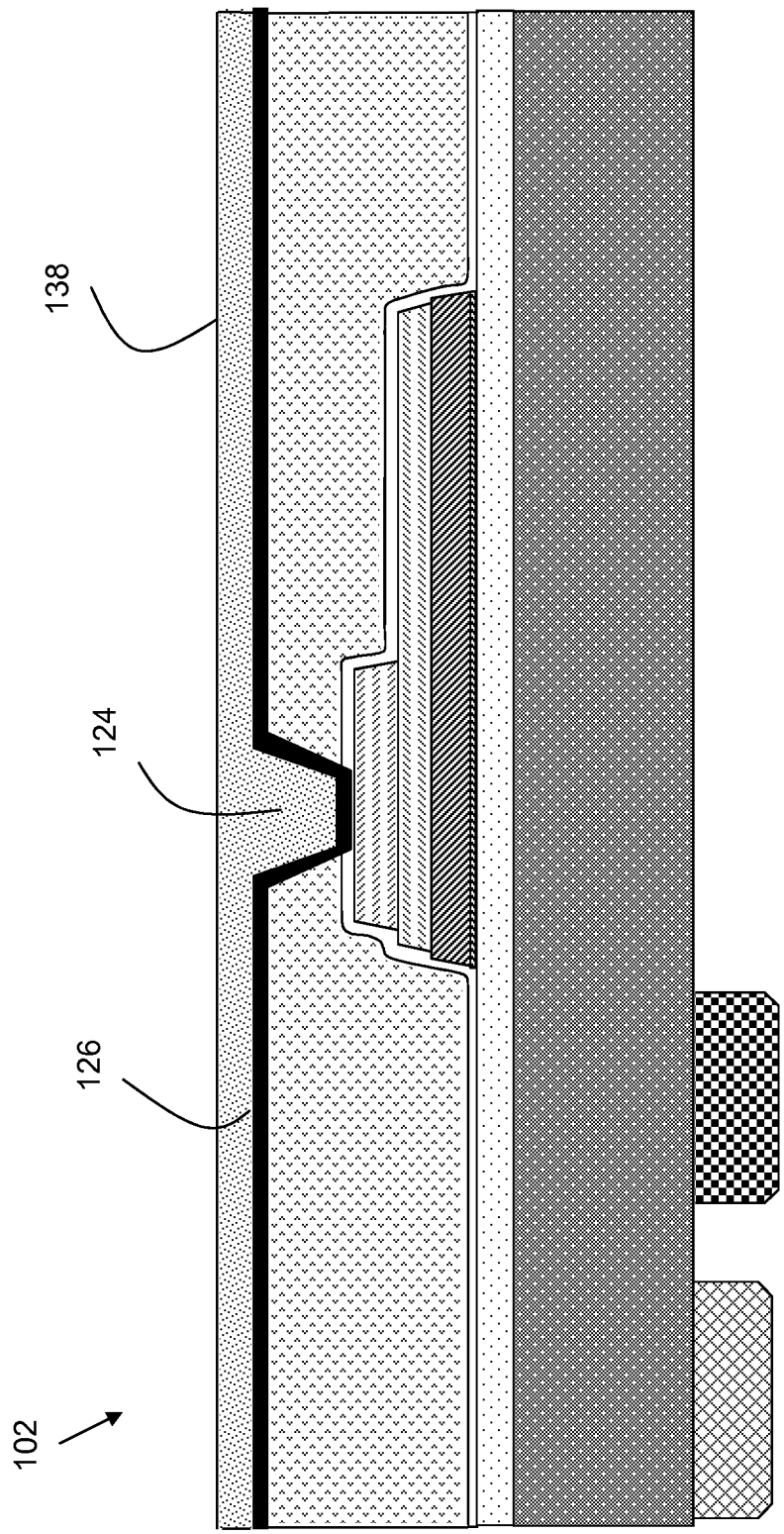
FIG. 4 shows a cross-section view of one embodiment of a next step in processing of FRAM chip in accordance with this invention.
Figure 5:
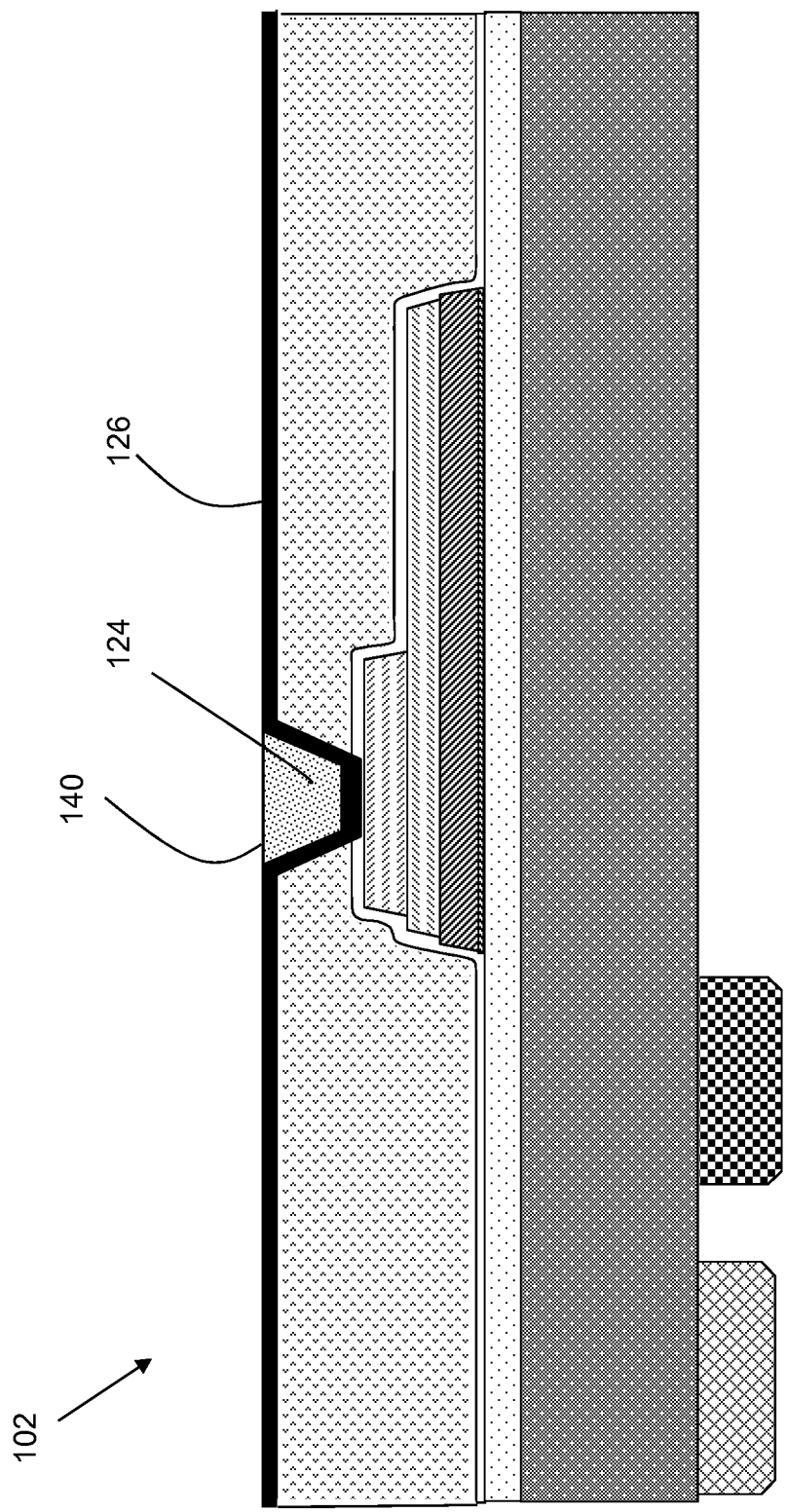
FIG. 5 shows a cross-section view of one embodiment of a next step in processing of FRAM chip in accordance with this invention.

Referring to FIGS. 4-7, cross-sectional views of embodiments of steps in processing FRAM chip 102 are illustrated. In FIG. 4, a silicon dioxide (SiOx) layer 138 may be deposited over the hydrogen barrier liner 126 to substantially fill trench 124. Depositing of SiOx layer 138 may include, for example, CVD or high-vacuum plasma-assisted chemical vapor deposition (HVP-CVD) at approximately 200 to 400 degrees Celsius. In FIG. 5, SiOx layer 138 (FIG. 4) may be polished using known oxide polishing techniques. Polishing SiOx layer 138 may form a silicon dioxide plug 140 in trench 124. Ir layer 130 (FIG. 2) or second Pt layer 136 (FIG. 3) of hydrogen barrier liner 126, 226 may act as polish stops.

Figure 6:
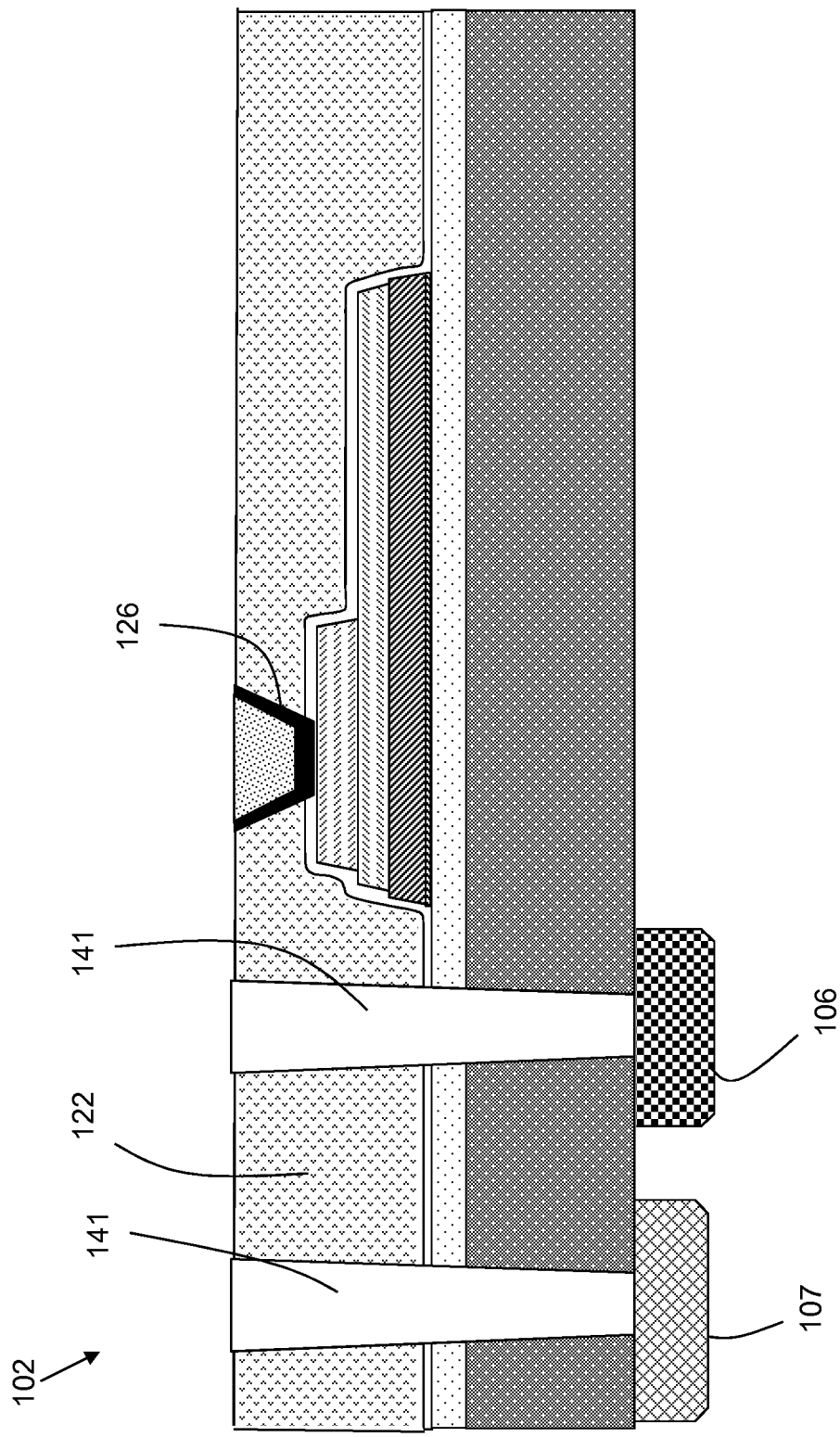
FIG. 6 shows a cross-section view of one embodiment of a next step in processing of FRAM chip in accordance with this invention.
Figure 7:
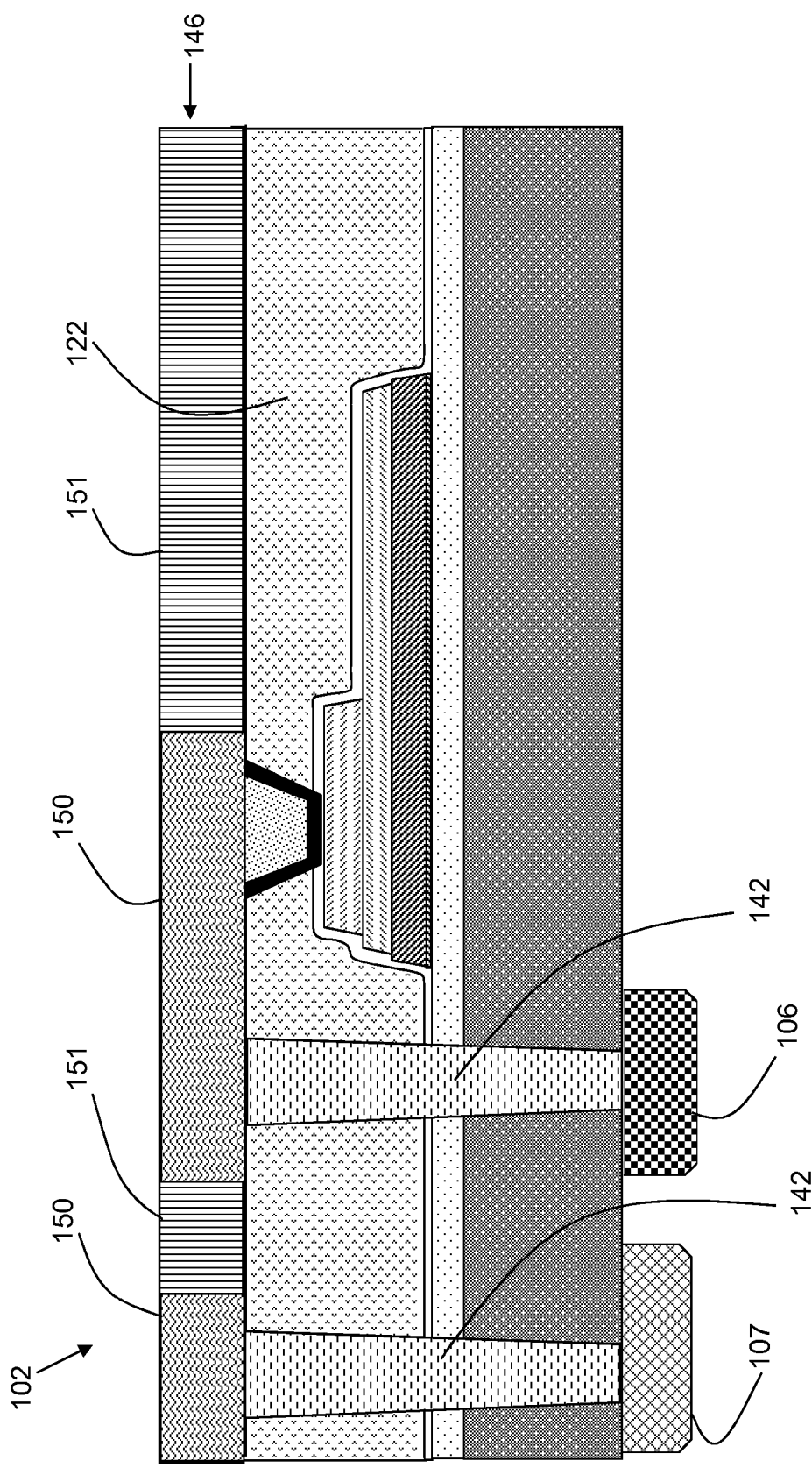
FIG. 7 shows a cross-section view of one alternative embodiment of a next step in processing of a FRAM chip in accordance with this invention.

In FIG. 6, exposed hydrogen barrier liner 126 (FIG. 2), 226 (FIG. 3) may be etched. Etching of hydrogen barrier liner 126, 226 may include, for example, employing a metal plasma etch for hydrogen barrier liner 126 including second IrOx layer 128 (FIG. 2). Alternatively, etching of hydrogen barrier liner 126, 226 may include, for example, employing a chlorine-based etch for hydrogen barrier liner 226 including second Pt layer 136 (FIG. 3). Etching for hydrogen barrier liner 126, 226 may be performed without a mask. The etching process exposes either second IrOx layer 128 or second Pt layer 136. Etching may then be performed to form at least one via 141 through second dielectric layer 122 to a least one source 106 or drain 107. In FIG. 7, at least one tungsten contact 142 may be formed in at least one via 141 to at least one source 106 or drain 107. A first metal layer 146 may be formed over the second dielectric layer 122. Forming first metal layer 146 may include depositing a third dielectric layer 151 and forming a metal wire 150 using conventional mask, resist, etching, and deposition techniques. Metal wire 150 may include copper or aluminum.

Figure 8:
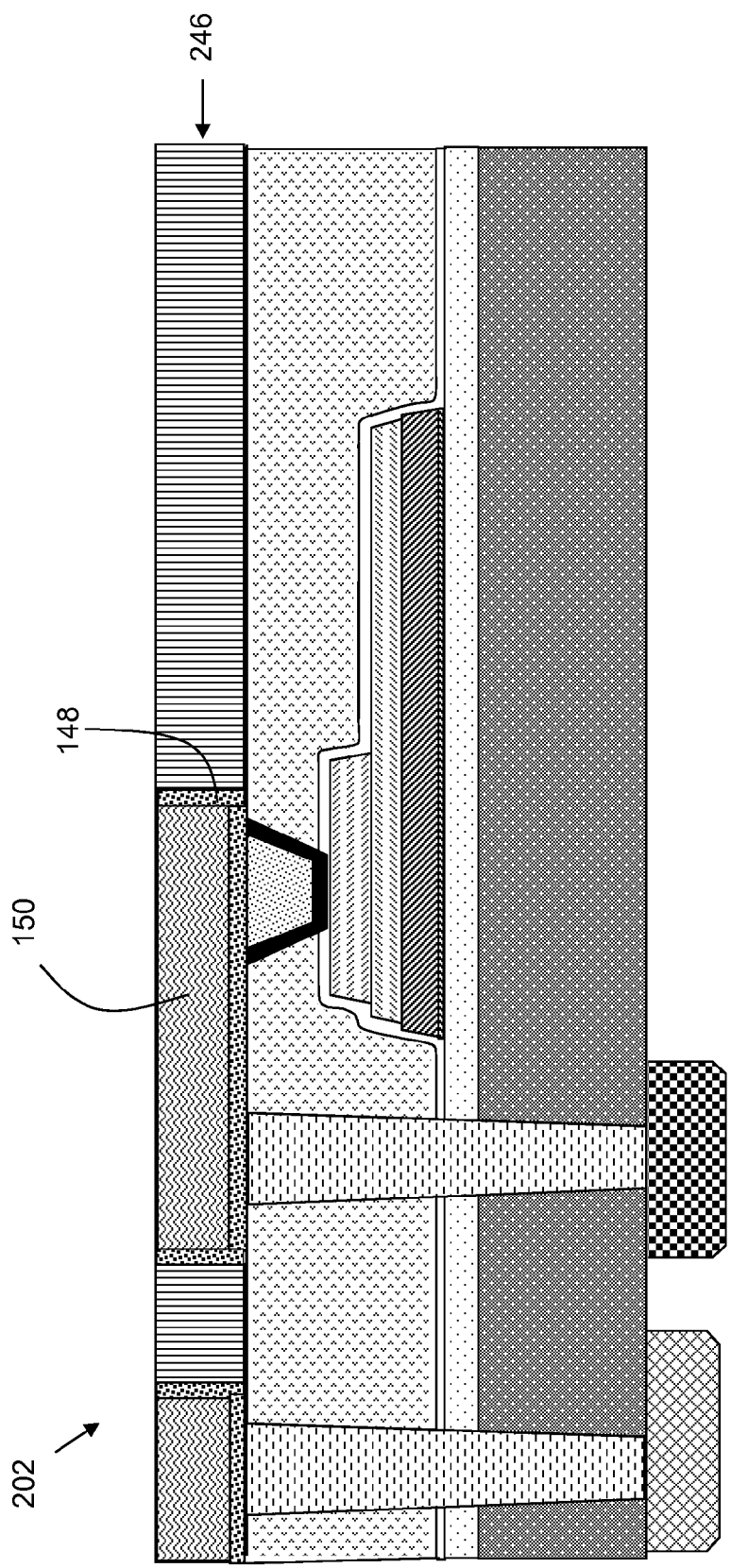
FIG. 8 shows a cross-section view of one alternative embodiment of a next step in processing of FRAM chip in accordance with this invention.
Figure 9:
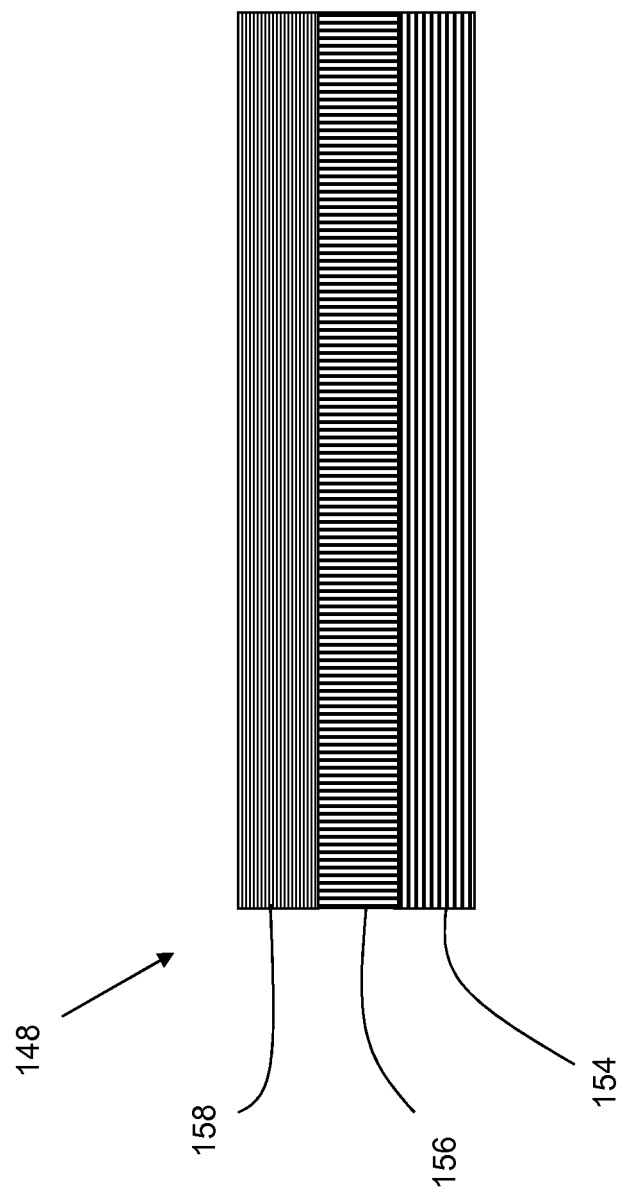
FIG. 9 shows a cross-section view of one embodiment of a first metal layer liner of FRAM chip in accordance with this invention.

Referring to FIG. 8, a cross section view of one alternative embodiment of processing a FRAM chip 202 is illustrated. In FIG. 8, forming first metal layer 246 may include depositing a first metal layer liner 148 and depositing a metal wire 150 over first metal layer liner 148. Referring to FIG. 9, a cross-section view of first metal layer liner 148 as applied to FIG. 8 is illustrated. First metal layer liner 148 may include a second Ti layer 154, forming a tantalum nitrite (TaN) layer 156 over second Ti layer 154, and a tantalum (Ta) layer 158 over TaN layer 156. Depositing of first metal layer liner 148 may include, for example, using PVD. First metal layer liner 148 may also act as a barrier to hydrogen.

Figure 10:
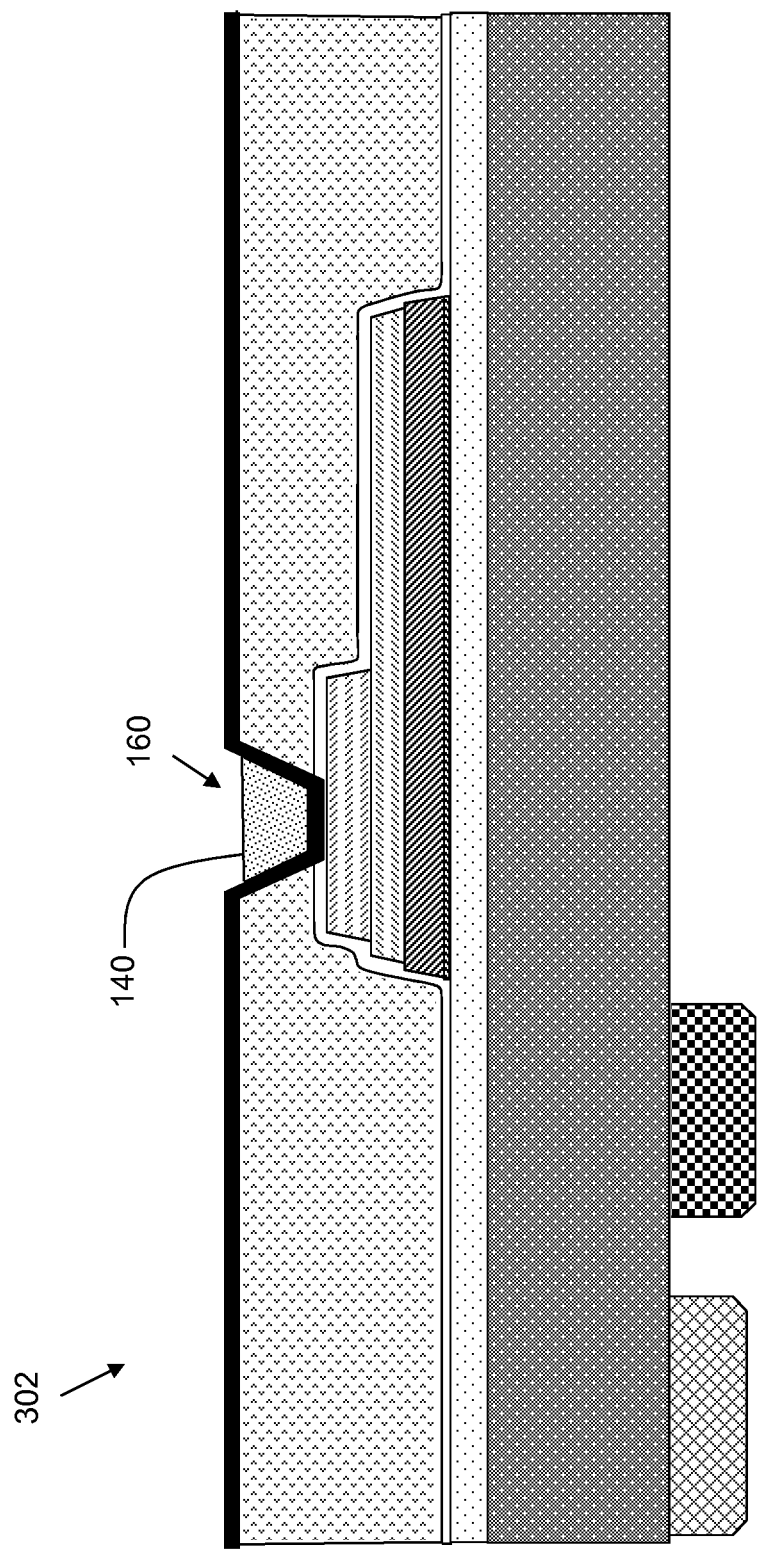
FIG. 10 shows a cross-section view of one alternative embodiment of a next step in processing of a FRAM chip in accordance with this invention.
Figure 11:
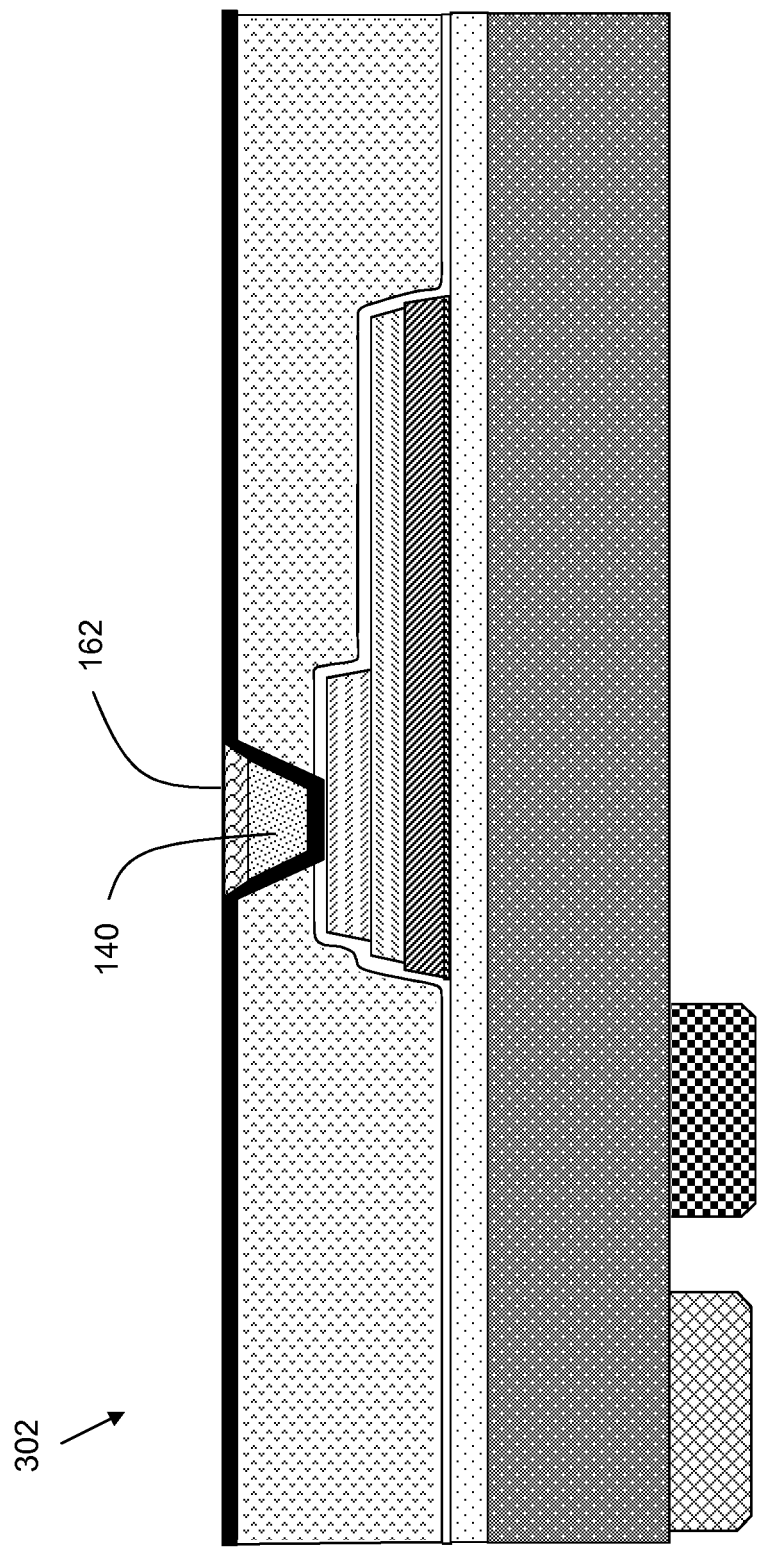
FIG. 11 shows a cross-section view of one embodiment of a next step in processing of FRAM chip in accordance with this invention.
Figure 12:
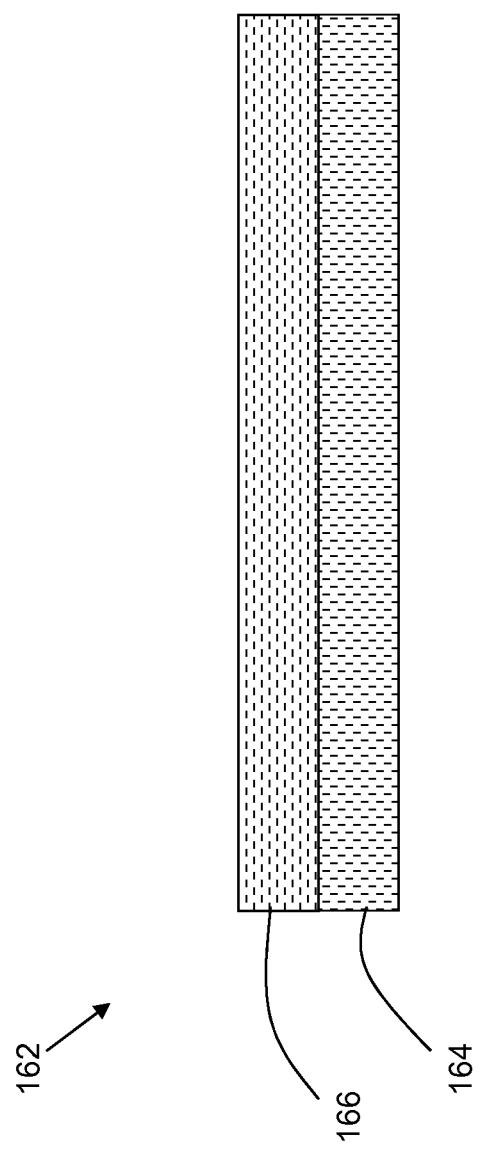
FIG. 12 shows a cross-section view of one embodiment of a layer of second metal of FRAM chip in accordance with this invention.

Referring to FIGS. 10-11, cross sectional views of alternative embodiments of processing a FRAM chip 302 is illustrated as applied to FIG. 5. In FIG. 10, a recess 160 may be formed over SiOx plug 140. Forming recess 160 may include performing a wet etch using a chemical appropriate for SiOx. In FIG. 11, a layer of second metal 162 may be formed over SiOx plug 140. A layer of second metal 162 may act as an additional hydrogen barrier. Layer of second metal 162 may improve contact between first metal layer 146 (FIG. 7), 246 (FIG. 8) and second IrOx layer 128 (FIG. 2) or second Pt layer 136 (FIG. 3). In FIG. 12, layer of second metal 162 as applied to FIG. 11 is illustrated. Layer of second metal 162 may include a titanium nitride layer 164 and a third titanium layer 166 over the titanium nitride layer 164.

Figure 13:
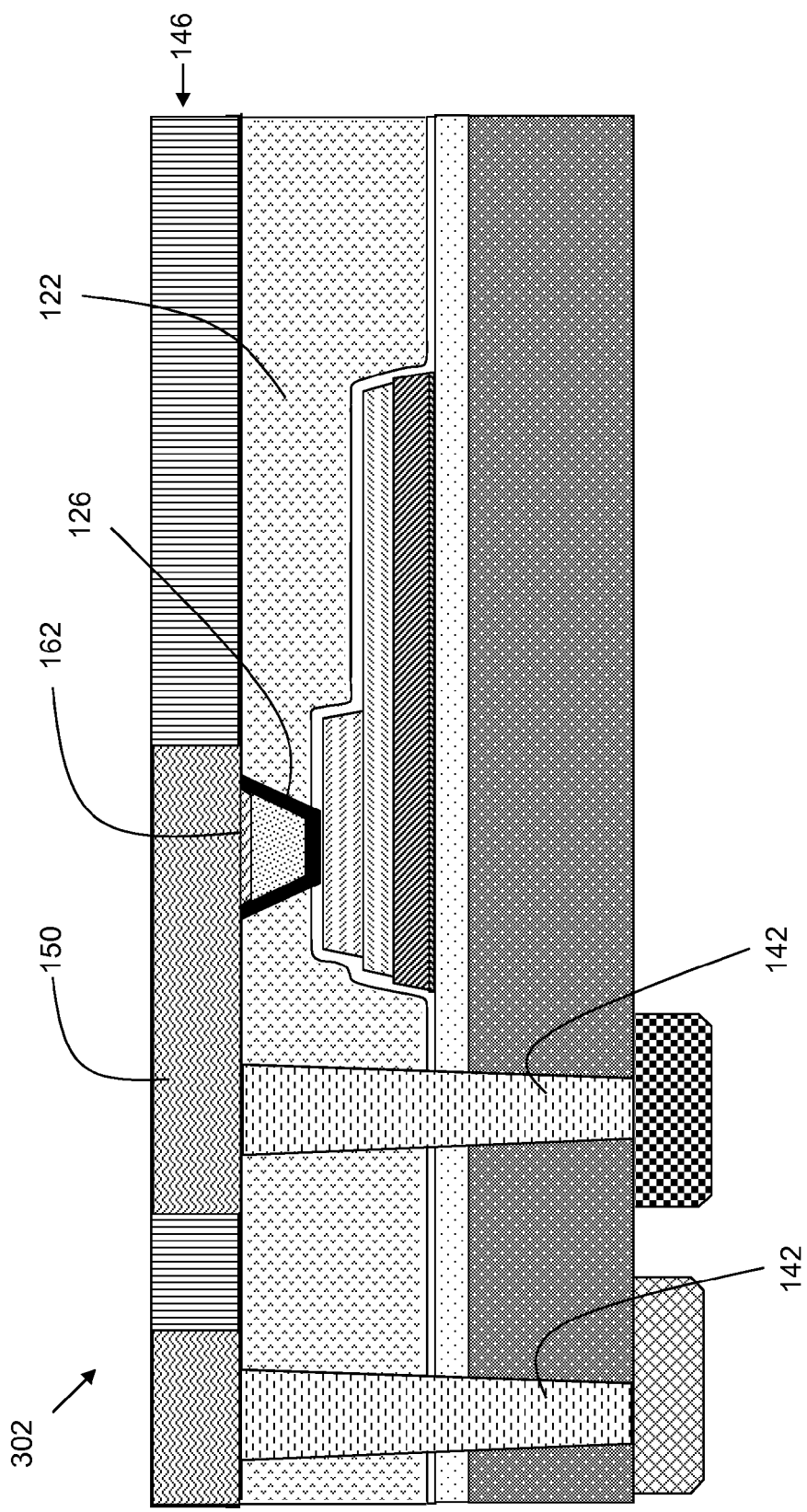
FIG. 13 shows a cross-section view of one embodiment of a next step in processing of a FRAM chip in accordance with this invention.
Figure 14:
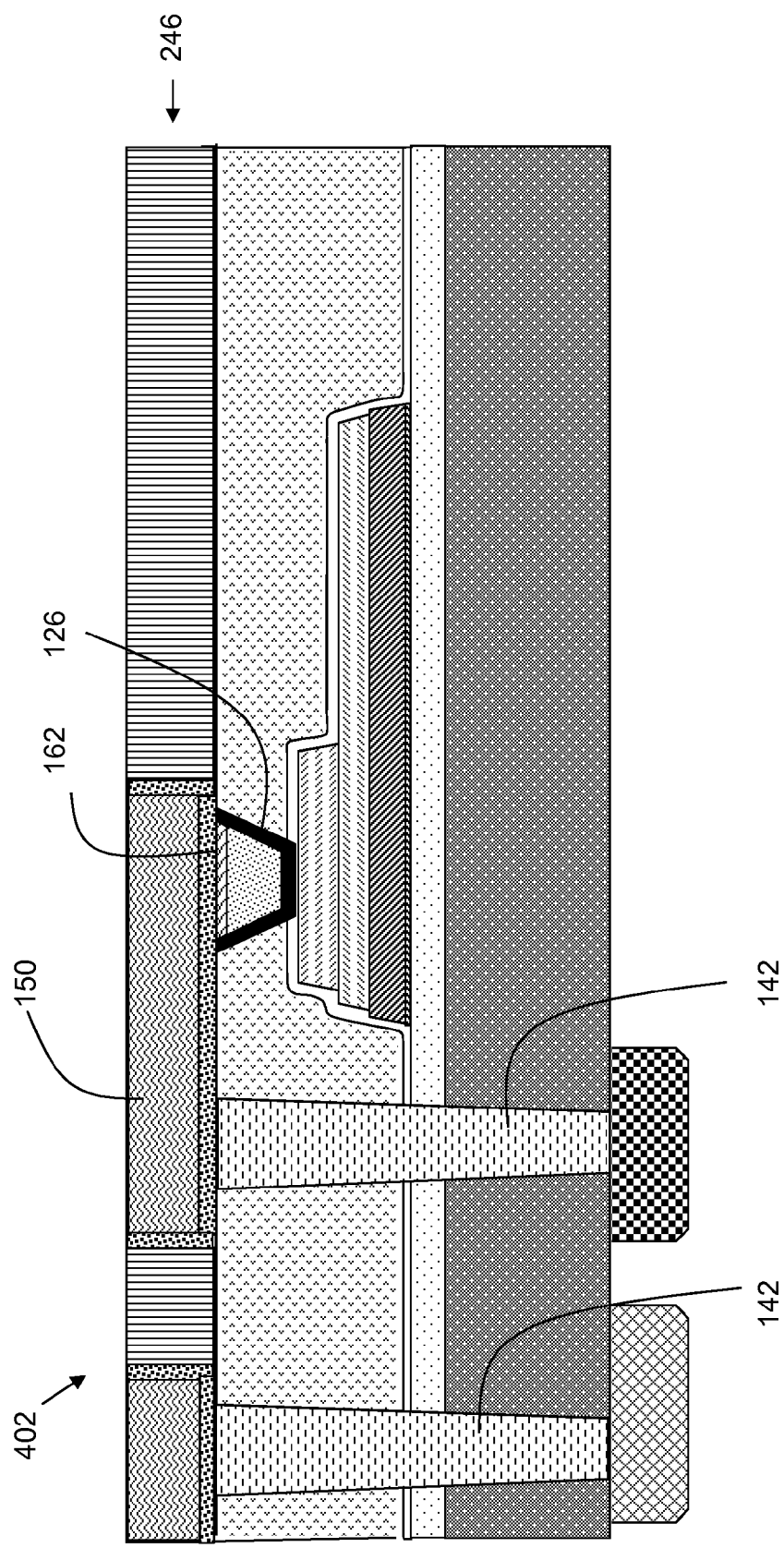
FIG. 14 shows a cross-section view of one alternative embodiment of a next step in processing of a FRAM chip in accordance with this invention.

Referring to FIG. 13, a cross section view of a next step in processing FRAM chip 302 is shown as applied to FIG. 11. The processes and structures described with respect to FIG. 6 are applied to the alternative embodiment illustrated in FIG. 13. Referring to FIG. 14, a cross section view of a next step in an alternative embodiment in processing FRAM chip 402 is shown as applied to FIG. 11. The processes and structures described with respect to FIG. 7 are applied to the alternative embodiment illustrated in FIG. 14. In FIGS. 13 and 14, FRAM chip 302 and FRAM chip 402 include layer of second metal 162 (FIG. 11) respectively. FIGS. 13 and 14 show first metal layer 146, 246 in contact with layer of second metal 162 with metal wire 150 contacting layer of second metal 162, hydrogen barrier layer 126, 226, second dielectric layer 122, and at least one tungsten contact 142. Forming first metal layer 146, 246 may be as described for the embodiments of FRAM chip 102 (FIG. 6) and 202 (FIG. 7).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method, comprising:
    forming a first dielectric layer over a substrate;
    forming a gate over the first dielectric layer;
    forming a first aluminum oxide layer over the gate and the first dielectric layer;
    forming a second dielectric layer over the first aluminum oxide layer;
    etching a trench through the second dielectric layer and the first aluminum oxide layer to the gate;
    forming a hydrogen barrier liner over the second dielectric layer, the hydrogen barrier liner lining the trench and contacting the gate;
    forming a silicon dioxide layer over the first aluminum dioxide layer, the silicon dioxide layer substantially filling the trench; and
    substantially removing the silicon dioxide layer leaving a silicon dioxide plug in the trench.

2. The method of claim 1, wherein the hydrogen barrier liner includes at least one of:
    an iridium oxide and iridium layer, a titanium layer over the iridium oxide and iridium layer, and a second aluminum oxide layer over the titanium layer; and
    a platinum layer, a titanium layer over the platinum layer, and a second aluminum oxide layer over the titanium layer.

3. The method of claim 2, further comprising:
    forming at least one of a source and a drain in the substrate prior to forming the first dielectric layer;
    forming a tungsten contact through the hydrogen barrier liner to at least one of the source and the drain; and
    forming a first metal layer over the second dielectric layer and the contact with the gate and over the tungsten contact.

4. The method of claim 3, wherein the first metal layer includes a metal wire, wherein the metal wire includes copper or aluminum.

5. The method of claim 3, wherein forming the first metal layer liner includes forming a second titanium layer, forming a tantalum nitrite layer over the second titanium layer, and forming a tantalum layer over the tantalum nitrite layer.

6. The method of claim 5, wherein the first metal layer includes a metal wire over the first metal layer liner, wherein the metal wire includes copper or aluminum.

7. The method of claim 2, further comprising:
    forming at least one of a source and a drain in the substrate prior to forming the first dielectric layer;
    forming a recess over the silicon dioxide plug;
    forming a layer of second metal in the recess;
    forming a tungsten contact through the hydrogen barrier liner to at least one of the source and the drain; and
    forming a first metal layer over the second dielectric layer and the contact with the gate and over the tungsten contact.

8. The method of claim 7, wherein forming the layer of second metal includes forming a titanium nitride layer and forming a third titanium layer over the titanium nitride layer.

9. A method, comprising:
    forming a first dielectric layer over a substrate;
    forming a gate over the first dielectric layer;

forming a first aluminum oxide layer over the gate and the first dielectric layer;

forming a second dielectric layer over the first aluminum oxide layer;

etching a trench through the second dielectric layer to the gate;

forming a hydrogen barrier liner over the second dielectric layer, the hydrogen barrier liner lining the trench and contacting the gate;

forming a silicon dioxide layer over the first aluminum dioxide layer, the silicon dioxide layer substantially filling the trench;

substantially removing the silicon dioxide layer leaving a silicon dioxide plug in the trench;

removing a portion of the silicon dioxide plug in the trench forming a recess in the trench over the silicon dioxide plug;

forming a titanium nitride layer over the silicon dioxide plug; and forming a first titanium layer over the titanium nitride layer.

10. The method of claim 9, wherein the hydrogen barrier liner includes at least one of:

an iridium oxide and iridium layer, a second titanium layer over the iridium oxide and iridium layer, and a second aluminum oxide layer over the titanium layer; and a platinum layer, a second titanium layer over the platinum layer, and a second aluminum oxide layer over the titanium layer.

11. The method of claim 10, further comprising:

forming at least one of a source and a drain in the substrate prior to forming the first dielectric layer;

forming a tungsten contact through the hydrogen barrier liner to at least one of the source and the drain;

forming a first metal layer over the second dielectric layer and the contact with the gate and over the tungsten contact.

12. The method of claim 11, wherein the first metal layer includes a copper layer or an aluminum layer.

13. The method of claim 11, wherein the first metal layer includes a liner and a copper layer over the liner, the liner including a third titanium layer, a tantalum nitrite layer over the titanium layer, and a tantalum layer over the tantalum nitrite layer.

14. The method of claim 11, wherein the first metal layer includes a liner and an aluminum layer over the liner, the liner including a third titanium layer, a tantalum nitrite layer over the titanium layer, and a tantalum layer over the tantalum nitrite layer.

* * * * *